(12) United States Patent
Kizilyalli et al.

(10) Patent No.: US 6,303,940 B1
(45) Date of Patent: Oct. 16, 2001

(54) CHARGE INJECTION TRANSISTOR USING HIGH-K DIELECTRIC BARRIER LAYER

(75) Inventors: Isik C. Kizilyalli, Orlando, FL (US); Marco Mastrapasqua, Annandale, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/339,894

(22) Filed: Jun. 25, 1999

Related U.S. Application Data
(60) Provisional application No. 60/117,186, filed on Jan. 26, 1999.

(51) Int. Cl.[7] ................................................. H01L 29/06
(52) U.S. Cl. .............................. 257/17; 257/26; 257/27; 257/29; 257/214
(58) Field of Search .................... 257/26, 27, 29, 257/214, 17, 410, 411

(56) References Cited

U.S. PATENT DOCUMENTS

| | | | |
|---|---|---|---|
| 5,280,182 | * | 1/1994 | Waho ..................................... 257/25 |
| 5,625,208 | * | 4/1997 | Jun ....................................... 257/214 |
| 5,675,157 | * | 10/1997 | Battersby ................................ 257/6 |
| 5,841,152 | * | 11/1998 | Ishikawa ................................ 257/14 |
| 5,895,931 | * | 4/1999 | Sakurai .................................. 257/29 |

FOREIGN PATENT DOCUMENTS 1 391 640    4/1975   (GB) .

OTHER PUBLICATIONS

"Functional Devices Based On Real Space Transfer In Si/SiGe Structure", M. Mastrapasqua et al., *IEEE Transactions On Electron Devices*, vol. 43, No. 10, Oct. 1996, pp. 1671–1677.

"High Transconductance And Large Peak–To–Valley Ratio Of Negative Differential Conductance In Three–Terminal InGaAs/InAlAs Real–Space Transfer Device", P.M. Mensz et al., *Applied Physics Letters*, vol. 57, No. 24, Dec. 10, 1990, pp. 2558–2560.

"Charge Injection Devices," S. Luryi et al., *Encyclopedia of Electrical and Electronics Engineering*, John Wiley & Sons Inc., pp. 3–7.

"Physics of Real–Space Transfer Transistors," I.C. Kizilyalli et al., *J. Applied Physics Letters*, vol. 65, No. 5, pp. 2005–2013.

"Characterization Of Stacked Gate Oxides by Electron Holography," W. D. Rau et al., Applied Physics Letters 68(24), Jun. 10, 1996.

Patent No. 5,814,562, Filed on Nov. 19, 1995 and issued on Sep. 29, 1998, to Martin Laurence Green et al.

Patent No. 4,851,370, filed on Dec. 29, 1987 and issued on Jul. 25, 1989, to Raymond H. Doklan et al.

(List continued on next page.)

*Primary Examiner*—William Mintel

(57) ABSTRACT

The present invention relates to a heterojunction structure based upon the oxide/high-k dielectric barrier. In exemplary embodiment, a silicon layer has a silicon dioxide layer thereon, and a high-k dielectric material disposed on the oxide layer. Thereafter, a metal layer, serving as the gate metal for the device is disposed on the high-k dielectric. The silicon dioxide layer has a relatively high barrier height, but has a relatively small thickness, and relative to the high-k dielectric, the barrier height differential fosters real space transfer. In this structure, the high barrier height of the silicon dioxide layer results in higher mobility and thereby greater substrate current. By virtue of the relative thick layer of high-k dielectric, leakage current is significantly reduced. Thus, the high-k dielectric material/oxide interface gives the needed barrier thickness to prevent leakage, but enables tunneling of hot electrons through the silicon dioxide into the metal layer with a sufficient applied voltage.

17 Claims, 2 Drawing Sheets

OTHER PUBLICATIONS

"Stacked High–ϵ Gate Dielectric For Gigascale Integration of Metal–Oxide–Semiconductor Technologies", P.K. Roy et al., *Applied Physics Letter*, vol. 72, No. 22, Jun. 1, 1998, pp. 2835–2837.

"MOS Transistors With Stacked SiO2–Ta2O5–SiO2 Gate Dielectrics for Giga–scale Integration Of CMOS Technologies", I. C. Kizilyalli et al., *IEEE Electron Device Letters*, vol. 19, No. 11, Nov. 1998, pp. 423–425.

* cited by examiner

CHARGE INJECTION TRANSISTOR USING HIGH-K DIELECTRIC BARRIER LAYER

CROSS-REFERENCE TO RELATED APPLICATION

This present application claims priority from Provisional application Ser. No. 60/117186 Jan. 26, 1999 (Inventor Case Number M. A. Abdelgadir et al 1–17).

FIELD OF THE INVENTION

The present invention relates to a Real Space Transfer (RST) electronic device.

BACKGROUND OF THE INVENTION

Real Space Transfer (RST) describes the process in which carriers in a narrow semiconductor layer, accelerated by an electric field parallel to the layer acquire high average energy and become hot carriers. These carriers surmount or can tunnel through an energy barrier into adjacent layers. This redistribution of carriers between parallel layers having different mobility leads to negative differential resistance (NDR). NDR is the result of the real space transfer of hot carriers' from a hot channel to a cooler channel, thus reducing the source-drain current for an increasing electric field. In gallium arsenide and silicon germanium based heterojunctions, relatively low heterojunction barriers make it possible for carriers in the channel to be accelerated by the source/drain field of a typical FET structure. These carriers may be accelerated to energies high enough to permit real-space transfer through the barrier (tunneling) or over the barrier. This effect is exploited in a variety of structures to include real-space transfer diodes and three and four terminal devices known as negative resistance field effect transistors (NERFET). In NERFETs, electrons heated in the channel of a heterojunction field effect transistor are collected in the gate or back gate electrode (thus the transport is perpendicular to the channel by virtue of RST).

FIG. 4 shows a typical charge injection transistor (CHINT). The basic device has a source 401, a drain 402 and a collector 403. In the illustrative CHINT of FIG. 4, the collector layer is $Si_xGe_{1-x}$, the barrier is Si and the channel is $Si_xGe_{1-x}$, although III-V based heterostructure CHINT's function in a similar manner as described herein. In operation, parallel transport is from the source to the drain of the device. When the applied electric field (bias) is increased sufficiently, carriers in the top layer 404 are heated by the source-drain field causing most not to reach the drain 402. Instead, they are injected over the barrier layer 405 into the collector layer 406 through RST. Si/Si-Ge heterojunctions have also been explored for use in RST based devices for high speed logic and oscillator applications. While silicon/silicon germanium heterostructures are of practical interest because of possibilities of integration of charge injection devices into standard CMOS logic and other devices, there are clearly drawbacks to RST devices based on silicon germnanium. To this end, while silicon germanium is more readily integrated into current CMOS processing sequences, fabrication complexity issues still remain with silicon germanium. Furthermore, the potential barrier between silicon and silicon germanium is on the order of 0.1 eV; and since almost all the bandgap discontinuity between the strained $Si_xGe_{1-x}$ channel and the Si barrier falls into the valence band, the devices based on RST in SiGe rely on hot holes as the carriers. This is less desirable than the case where the carriers are electrons as the mobility of holes is lower than that of electrons.

Charge injection transistors, have been fabricated using III-V heterostructures to include GaAs/AlGaAs and InGaAs/InAlAs heterostructures. While there are certain benefits achieved through the III-V based heterojunctions there are drawbacks to such structures. Gallium arsenide structures are generally more expensive and more difficult to fabricate than their silicon counterparts due to the complexity of fabrication steps as well as materials required. Furthermore, while AlGaAs/GaAs and InGaAs/InAlAs heterojunctions can be used to form an RST based devices, the potential barrier between the two layers is on the order of 0.3 eV and 0.5 eV, respectively. Further details of Si/SiGe and III-V based CHINT devices can be found in *Functional Devices Based on Real Space Transfer in Si/SiGe Structure*, IEEE Transcations on Electron Devices, Vol 43, No. 10, October 1996, to Mastrapasqua, et al, p 1671–1677 and High Transconductance and Large Peak-to-Valley Ratio of Negative Differential Conductance in Three Terminal InGaAs/InAlAs Real-Space Transfer Devices, Appled Physics Letters Vol. 57, 1990, to Mensz, et al, respectively. The disclosures of these articles are specifically incorporated herein by reference.

Accordingly, leakage current issues tend to plague the gallium arsenide based devices. Thus, the adaptability of gallium arsenide and silicon germanium based heterojunction RST devices is suspect because of the attendant problems associated with fabrication, as well as mobility issues and leakage current issues. Accordingly, what is needed is a structure which can be readily incorporated into silicon MOS process sequences, while improving the performance of RST based devices.

SUMMARY OF THE INVENTION

The present invention relates to a charge injection transistor having a first barrier layer which has a conduction band energy level that is more than 0.5 eV greater than the conduction band of a second barrier layer. The first barrier layer is generally thin to foster tunneling of hot carriers. The second barrier is relatively thick and reduces leakage current. In an exemplary embodiment, a high-k dielectric material is used as the second barrier layer, with a grown silicon dioxide layer having a thickness of less than 20 Å as the first barrier layer. The barrier height differential between the high-k and silicon dioxide fosters RST and the thin silicon dioxide guarantees a good quality interface resulting in higher mobility in the channel and thereby a greater RST current.

BRIEF DESCRIPTION OF THE DRAWING

The invention is best understood from the following detailed description when read with the accompanying drawing figures. It is emphasized that, in accordance with common practice in the semiconductor industry, the various features are not necessarily to scale. In fact, the dimensions of the various features may be arbitrarily increased or reduced for clarity of discussion.

DETAILED DESCRIPTION OF THE INVENTION

Figure 3:
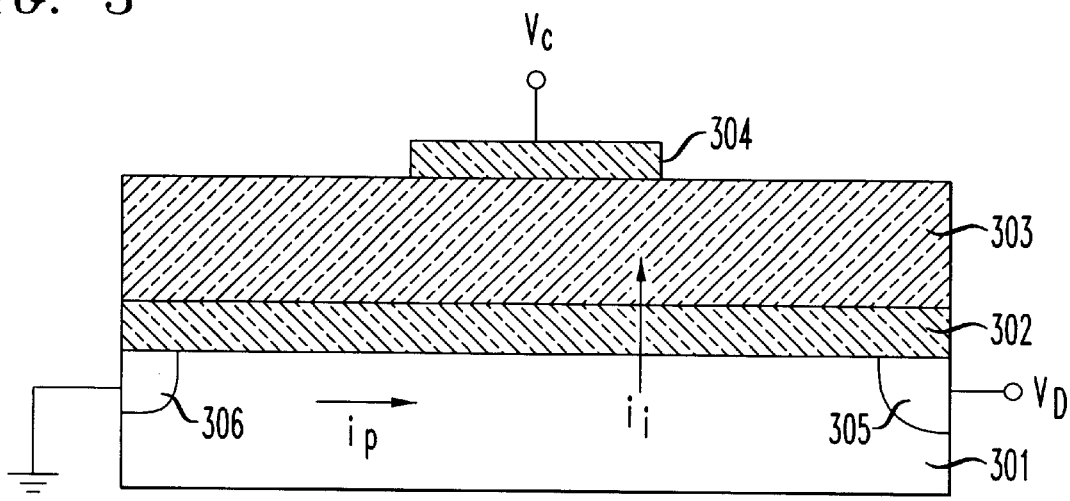
FIG. 3 is a cross-sectional view of an exemplary charge injection transistor structure based on the invention of the present disclosure.
Figure 4:
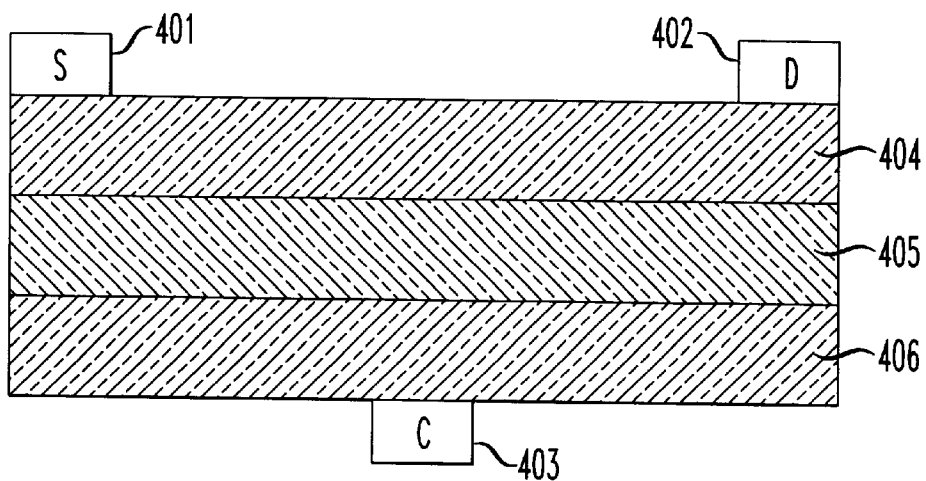
FIG. 4 is a prior art view of a charge injection transistor structure based on gallium arsenide or silicon germanium.

The invention may be understood most generally from a review of FIG. 3. As is discussed below in detail, and in accordance with an exemplary embodiment, a substrate layer 301 has a drain contact region 305 and a grounded source 306. In this exemplary embodiment, the substrate is preferably silicon and is oxidizable. A grown layer of $SiO_2$ and a stress free layer of $SiO_2$ thereunder are shown generally as 302. A layer of high-k dielectric 303, exemplary tantalum pentoxide, is disposed thereon. The collector contact 304 is preferably a conductor such as a metal (e.g., tungsten) or other suitable conductor. The source-drain field causes parallel transport under low field conditions; and under high field conditions, carrier injection perpendicular to the channel. To this end, the parallel current is represented by $i_p$, while the injected current that results from heating electrons and their injection through or over the $SiO_2$ barrier layer is represented by $i_i$. The embodiment described briefly above is illustrative of the invention, a charge injection transistor having a first barrier layer which has a conduction band energy level that is more than 0.5 eV greater than the conduction band of a second barrier layer. The first barrier layer is generally thin to foster tunneling of hot carriers. The second barrier is relatively thick and diminishes leakage current.

Figure 2:
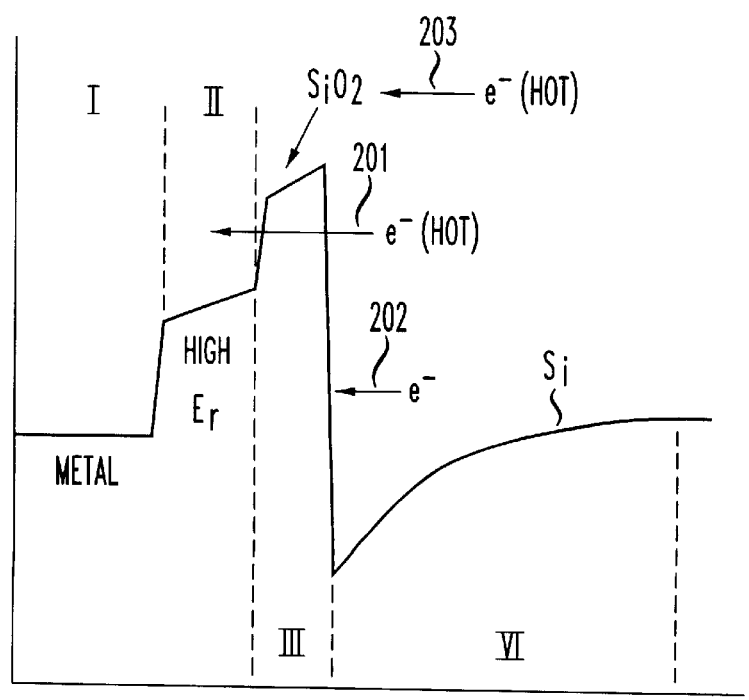
FIG. 2 is an energy band diagram of the invention of an exemplary embodiment of the present disclosure.

The physics of the charge injection transistor of the exemplary embodiment is understood through a review of the conduction band diagram of FIG. 2. The transistor is based upon the control of the collector current and reduction in drain current by the heating voltage between the drain and source. The silicon layer shown (region IV) has hot electrons which tunnel through (for example those with energy as shown at 201) or overcome (for example those with energy 203) the barrier of silicon dioxide (region III). This layer of silicon dioxide is relatively thin; on the order of 20 Å (2.0 nm) or less. These electrons are energetic enough to ultimately end up at the collector contact (region III and exemplary metal in this embodiment). However, an electron having an energy shown at 202 would have a very low probability of tunneling (low transmission coefficient) through the $SiO_2$ and high-k layer (region II). Thus, leakage current may be reduced by virtue of the present structure.

Figure 1:
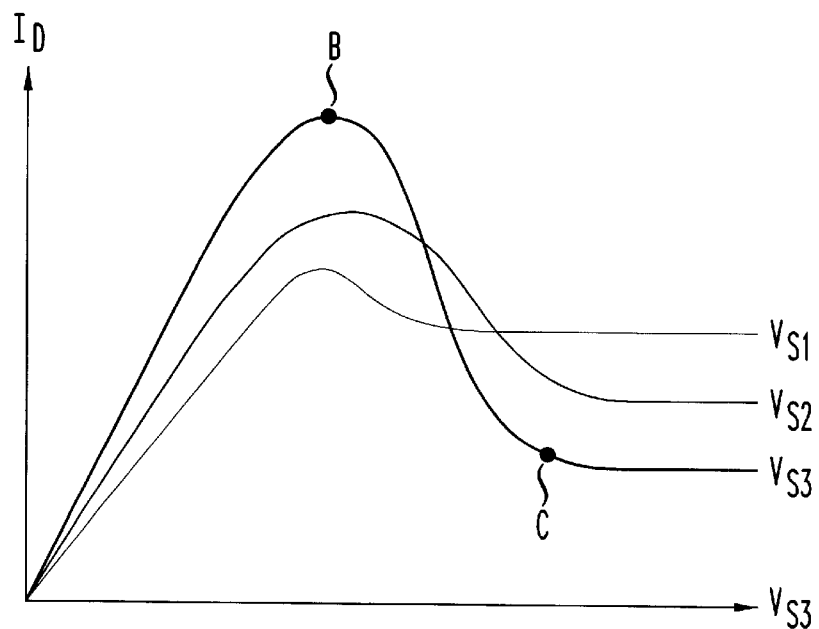
FIG. 1 is a graphical representation of an illustrative current-voltage (I-V) curve showing negative differential resistance in an exemplary embodiment.

The carriers in the emitter layer are heated by the source drain field, with the majority of hot electrons not reaching the drain, but rather being injected into the collector layer resulting in a strong negative differential resistance. The I-V characteristic shown in FIG. 2 shows the drain current, $I_D$, versus drain voltage $V_D$ (relative to the grounded source) for various collector voltages, $V_S$, again relative to the source potential. As can be readily appreciated through a review of FIGS. 1 and 2, as the bias voltage at the drain is increased, the drain current (from parallel transport) increases to a point shown at B in FIG. 1. As the injection current (202,203 in FIG. 2) across the barrier layer of silicon dioxide dominates the carrier transport, the drain current rapidly decreases until at the point C in FIG. 1, a valley is reached. The I-V characteristic is asymptotic in nature, with the flattened region of the curve believed to be due to field screening and a reduction in the drain-collector field. The field screening is theorized to be the result of a depletion region created at the drain region, which results in drain current saturation. As the drain current reaches saturation, the "diverted" (injected) charge to the substrate saturates necessarily. The charge injection transistor of the invention of the present disclosure can be made to operate between regions B and C. As the peak to valley ratio is increased, this device can be used effectively as a switch, or high frequency oscillator. Other applications of the invention beyond these two examples are clearly possible and would be readily apparent to one of ordinary skill in the art having had the benefit of the present disclosure.

The charge injection transistor shown in the exemplary embodiment in FIG. 3 is fabricated with materials and by techniques disclosed in U.S. patent application Ser. No. 08/995,435 to Kizilyalli et al. filed Dec. 22, 1997 and U.S. patent application Ser. No. 09/339,895. Each of these patent applications is specifically incorporated by reference herein, and details of the fabrication steps will be eliminated in the interest of brevity. The substrate 301 is preferably an oxidizable layer, for example silicon. This could be a monocrystalline silicon substrate on an epitaxial layer of silicon on a substrate. A layer of silicon dioxide is grown thereon. The grown oxide in the exemplary embodiment has a thickness on the order of 3–5 Angstroms, while the stress free oxide layer grown thereunder has a thickness on the order of 3–8 Angstroms. The grown and stress free layers are referenced herein as the first barrier layer and are represented as 302. The high-k dielectric layer 303 is deposited on the layer 302 by standard technique, and can be $Ta_2O_5$, $ZrO_2$, $TiO_2$ and perovskite materials. This layer has a thickness on the order of 30–100 Angstroms (although this layer can be 1000 Angstroms thick) and is referenced herein as the second barrier layer. The source and drain are doped $n^+$ and the channel is doped $n^-$, $p^-$ or n, with the device preferably being an enhancement mode device. The source, drain and tub are formed by standard techniques well known in the art. Finally, it is of interest to note that other materials and structures can be employed to effect the transistor of the present invention. To this end, the basic requirement of the present invention is a junction between a dimensionally thin, high potential barrier material (the first barrier layer) and a relatively thick, lower potential barrier material (the second barrier layer) that enables RST. A CHINT device functions well when the potential difference between the first and second barrier layers is greater than about 0.5 eV. Accordingly, it is possible that other materials will enable RST and the resultant CHINT. While silicon is the exemplary substrate, it is conceivable that other materials may be employed as the substrate, with other materials disposed thereon to function as the first barrier layer having the characteristics described above. For example, the substrate may be a III-V compound semiconductor or a SiGe substrate.

As discussed in the above-incorporated U.S. patent application to Kizilyalli et al., one important consideration is the need to avoid exposing the high-k layer to temperatures which exceed the crystal phase transformation temperature. Briefly, issues of leakage arise when the high-k layer crystallizes. As can be appreciated by one of ordinary skill in the art, the high-k layer in the present invention is necessary to avoid leakage current. If this layer were leaky due to crystallization, deleterious affects could result. By techniques discussed in the application to Kizilyalli, et al, the phase transformation temperature can be increased to avoid crystallization during fabrication of the device. In the exemplary embodiment in which $Ta_2O_5$ is the high-k material, the oxidation/densification of the grown oxide layer results in an elevation of the phase transformation temperature of $Ta_2O_5$ to on the order of 850° C. Further elevation of this temperature to on the order of 950° C. can be achieved through doping or implantation as disclosed in the incorporated reference.

As can be appreciated from the above disclosure of the exemplary embodiment, the high-k dielectric/thin oxide layer interface provides an advantageous charge injection transistor compared to the known charge injection transistors based on gallium arsenide or silicon germanium, as discussed in more detail above. The exemplary embodiment is readily adaptable to conventional silicon processing technology, as disclosed in the patent applications which are incorporated by reference. This results in less complex processing when compared to other charge injection devices; and a reduction in cost of materials and processing and certain environmental advantages compared to known gallium arsenide based devices, in particular.

The invention having been described in detail, is clear that variations and modifications of the invention of the present disclosure are within the purview of one of ordinary skill in the art. To the extent that the disclosure of the present invention enables obvious modifications to the basic structure of an oxide-high-k dielectric interface for use in a real space transfer device, such are deemed within the scope of the present invention.

What is claimed:

1. An electronic device, comprising:
    a first barrier layer on a substrate;
    a second barrier layer on said first barrier layer, said second barrier layer being an oxide; and
    a layer disposed on said second barrier layer, wherein hot carriers are injected across said first barrier layer to said layer.

2. An electronic device as recited in claim 1, wherein said first barrier layer further comprises a grown layer of silicon dioxide with a stress free layer of silicon dioxide thereunder.

3. An electronic device as recited in claim 1, wherein said substrate is oxidizable.

4. An electronic device as recited in claim 1, wherein said first barrier layer is $SiO_2$.

5. An electronic device as recited in claim 1, wherein second barrier layer is selected from the group consisting of $Ta_2O_5$, $ZrO_2$ and perovskite materials.

6. A charge injection transistor (CHINT), comprising:
    a silicon layer having a source and a drain;
    a first barrier layer of $SiO_2$ disposed on said silicon layer;
    a second barrier layer of high-k dielectric material disposed on said layer of $SiO_2$; and
    a collector layer disposed on said second high-k barrier layer, wherein hot carriers are injected across said first barrier layer to said collector layer.

7. An electronic device as recited in claim 6, wherein said high-k dielectric layer is selected from the group consisting of $Ta_2O_5$, $TiO_2$, $ZrO_2$ and perovskite materials.

8. A charge injection transistor as recited in claim 6, wherein said first barrier layer of $SiO_2$ is further comprises a grown $Sio_2$ layer having a stress free $SiO_2$ layer thereunder.

9. A charge injection transistor as recited in claim 6, wherein said second barrier layer substantially eliminates leakage current thereacross.

10. A charge injection transistor as recited in claim 6, wherein said second barrier layer of high-k dielectric material is substantially not crystalline.

11. A charge injection transistor as recited in claim 1, wherein said high-k layer is substantially not crystalline.

12. A charge injection transistor as recited in claim 8, wherein said grown $SiO_2$ layer has a thickness on the order of 3–8 Å, and said stress free $SiO_2$ layer has a thickness on the order of 3–5 Å.

13. A charge injection transistor as recited in claim 1, wherein said first barrier layer has a thickness on the order of 6–20 Å.

14. An electronic device as recited in claim 3, wherein said oxidizable layer is epitaxial silicon.

15. An electronic device as recited in claim 5, wherein said second barrier layer has a thickness in the range of approximately 30–1000 Å.

16. An electronic device as recited in claim 1, wherein said first barrier layer has a first barrier height and said second barrier layer has a second barrier height, and wherein said first barrier height is greater than said second barrier height.

17. An electronic device as recited in claim 1, wherein said first barrier layer is $SiO_2$ and further comprises a grown $SiO_2$ layer having a stress free $SiO_2$ layer thereunder.

* * * * *